United States Patent [19]

Burke

[11] Patent Number: 5,557,241

[45] Date of Patent: Sep. 17, 1996

[54] LINEAR CHIRP GENERATION USING VCO TUNING WITH POLYNOMIAL PREDISTORTION

[75] Inventor: Peter J. Burke, Commack, N.Y.

[73] Assignee: AIL Systems, Inc., Deer Park, N.Y.

[21] Appl. No.: 449,202

[22] Filed: May 24, 1995

[51] Int. Cl.[6] ................................................ H03B 23/00
[52] U.S. Cl. ........................ 331/4; 331/178; 327/132; 327/137
[58] Field of Search ........................................ 331/4, 178

[56] References Cited

U.S. PATENT DOCUMENTS

| | | | |
|---|---|---|---|
| 3,530,399 | 9/1970 | Goggins, Jr. | 331/178 X |
| 3,699,448 | 10/1972 | Martin et al. | 331/4 |
| 4,245,196 | 1/1981 | Peebles, Jr. et al. | 331/178 |

Primary Examiner—Siegfried H. Grimm
Attorney, Agent, or Firm—Hoffmann & Baron

[57] ABSTRACT

An ultra-linear chirp generator includes a voltage controlled oscillator (VCO) having a tuning characteristic which is naturally nonlinear, a linear ramp generator which generates a linearly ramping output signal having a linear slope characteristic with respect to time, a polynomial correction waveform generator which generates a polynomial correction signal, and a summer which is responsive to and sums the linearly ramping output signal and the polynomial correction signal. The summer generates a VCO tuning signal for tuning the VCO. The tuning signal corresponds to the linearly ramping output signal predistorted with a nonlinearity opposite to the natural nonlinearity of the VCO tuning characteristic. The linear chirp generator also includes a phase locked loop which is responsive to the output signal of the VCO and which has a reference frequency which is related to the repetition rate of the output signal of the VCO.

6 Claims, 7 Drawing Sheets

LINEAR CHIRP GENERATION USING VCO TUNING WITH POLYNOMIAL PREDISTORTION

COPYRIGHT NOTICE

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

1. Field of the Invention

The present invention relates to a method and apparatus for linearizing the output signal of a voltage controlled oscillator (VCO), and more specifically relates to a linear chirp generator and method for use as a swept local oscillator (SLO) in a wide bandwidth compressive receiver or the like.

2. Description of the Prior Art

A chirp is a frequency modulated signal having a linear frequency change versus time characteristic.

There are several techniques for creating high speed linear chirps. These include impulse excitation of a dispersive delay line (DDL), tuning a nonlinear voltage controlled oscillator (VCO) with a piece-wise predistorted voltage generator, and tuning an ultra-linear VCO with a linear voltage generator.

Present technology for impulse excitation of a DDL can provide time-bandwidth products of approximately 500 to 1000. While this may marginally satisfy the high speed, wide bandwidth requirements of a compressive receiver swept local oscillator (SLO), the resultant chirp suffers from a poor signal to noise ratio (SNR) due to the very high inherent insertion loss of the DDL (approximately 30 dB) as well as the expansion loss (which is also approximately 30 dB).

Tuning a nonlinear VCO with a piece-wise predistorted ramp voltage generator may be used to satisfy the SLO requirements of a compressive receiver. However, the resultant circuit becomes fairly complex and extremely cumbersome to align, as described in the publication, *Microwave Receivers with Electronic Warfare Applications*, John Wiley and Sons, New York, 1986, authored by J. Tsui. The complexity is a result of the required linearity, which is preferably less than 0.15%. To linearize the nonlinear VCO, the tuning curve is broken down into many small pieces. Each piece must be separately timed and adjusted, and then be recombined to form the final predistorted tuning voltage. This process is usually empirically defined due to the difficulties in measuring the dynamic frequency versus time characteristics of the resultant chirp.

An ultra-linear VCO driven with a linear voltage generator can satisfy the SLO requirements of a wide bandwidth compressive receiver, as described in the article, *VCO Based Chirp Generation For Broad Bandwidth Compressive Receiver Applications*, 1993 IEEE MTT-S International Microwave Symposium Digest, pp. 1113–1115, authored by J. Levy, P. Burke, L. Cohen, and R. Cecchini. A millimeter wave VCO operating at 50 GHz, for example, with an ultra-linear tuning characteristic, for example, 0.1%, can create the chirp. However, local oscillators, filters and frequency conversion components are required to shift the chirp to the microwave frequency range. This complexity results in increased cost, power consumption and size as compared to creating a chirp directly at microwave frequency. Also, incidental FM (Frequency Modulation), which is usually a function of the center frequency, is greater at the up-converted frequencies than at baseband.

OBJECTS AND SUMMARY OF THE INVENTION

It is an object of the present invention to provide a method and apparatus for microwave chirp generation having characteristics including high speed, such as less than one μsec, wide bandwidth, such as greater than 1 GHz, ultra-linear, such as less than 0.15% and high signal to noise ratio (SNR), such as greater than 60 dB.

It is another object of the present invention to provide a microwave chirp generator which provides long term average frequency stabilization of the chirp.

It is yet another object of the present invention to provide an ultra-linear microwave chirp generator and method which allows for simple, analytically derived, tune predistortion alignment.

It is a further object of the present invention to provide a linear ramp generator for use in an ultra-linear chirp generator, which linear ramp generator maintains the slope of a periodic, linearly ramping signal that is generated as well as the average magnitude of the signal.

It is yet a further object of the present invention to provide a linear ramp generator that minimizes drift effects caused by changes in the operating environment as well as the aging of components used in the generator.

It is still a further object of the present invention to provide a linear ramp generator and method which generate a high speed, ultra-linear voltage versus time waveform, having fast trace and retrace and low settling time characteristics.

It is yet another object of the present invention to provide an ultra-linear ramp generator and method employing a voltage controlled oscillator (VCO) which generates a polynomial predistorted tuning signal for tuning the VCO.

It is still another object of the present invention to provide a method and apparatus for generating an ultra-linear chirp which overcome the inherent disadvantages of known methods and apparatus.

In accordance with one form of the present invention, a linear chirp generator includes a voltage controlled oscillator (VCO) which is naturally nonlinear, and a linear ramp generator. The linear ramp generator generates a linearly ramping output signal having a linear slope with respect to time.

The linear chirp generator also includes a polynomial correction waveform generator. The polynomial correction waveform generator generates a polynomial correction signal.

The chirp generator also includes a summer. The summer is responsive to and sums the linearly ramping output signal of the ramp generator and the polynomial correction signal of the polynomial correction waveform generator, and generates a VCO tuning signal for tuning the VCO. The tuning signal corresponds to the linearly ramping output signal predistorted with a nonlinearity opposite to the natural nonlinearity of the VCO tuning characteristic. The tuning signal is provided to the VCO, and the VCO generates an output signal having a linear frequency versus time chirp.

The linear chirp generator also preferably includes a phase locked loop (PLL). The PLL is responsive to the output signal of the VCO, and has a reference frequency which is related to the repetition rate of the output signal. The PLL generates an output signal which is provided to the summer. The summer sums the PLL output signal with the linearly ramping output signal and polynomial correction signal, whereby the average frequency of the VCO output signal (i.e., the chirp) is maintained.

A method of generating a linear chirp from a VCO having a tuning characteristic which is naturally nonlinear, in accordance with the present invention, includes the steps of generating a linearly ramping signal having a linear slope characteristic with respect to time, and generating a polynomial correction signal.

The method further includes the step of summing the linearly ramping signal and the polynomial correction signal and generating from the summation of these two signals a tuning signal for tuning the VCO. The tuning signal corresponds to the linearly ramping signal predistorted with a nonlinearity opposite to the natural nonlinearity of the VCO tuning characteristic.

The method of the present invention further includes the step of providing the tuning signal to the VCO, whereby the VCO generates an output signal having a linear frequency versus time chirp.

In accordance with a further aspect of the invention, a linear ramp generator includes a storage device which accumulates charge, a first feedback loop and a second feedback loop. The first feedback loop is coupled to the storage device and controls the rate of charge accumulating on the storage device. The second feedback loop is also coupled to the storage device and maintains the charge on the storage device at a constant average level.

These and other objects, features and advantages of the present invention will be apparent from the following detailed description of illustrative embodiments thereof, which is to be read in connection with the accompanying drawings.

DETAILED DESCRIPTION OF THE PREFERRED EMBODIMENTS

Figure 1:
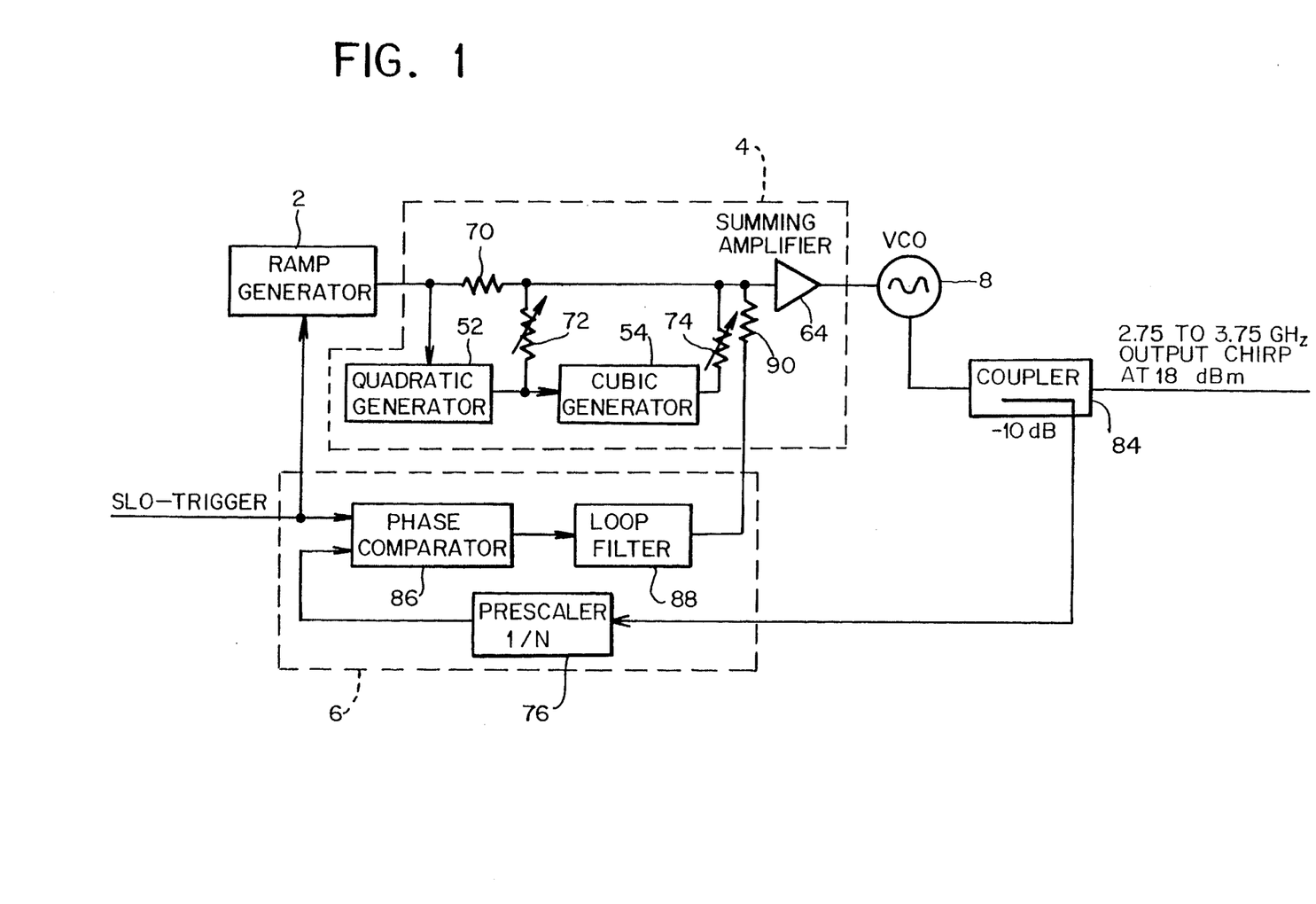
FIG. 1 is a block diagram of an ultra-linear chirp generator formed in accordance with one form of the present invention.

Initially referring to FIG. 1 of the drawings, it will be seen that an ultra-linear chirp generator formed in accordance with the present invention preferably includes four major sections—a linear ramp generator 2, a polynomial correction waveform generator 4, a phase locked loop (PLL) 6, and a voltage controlled oscillator (VCO) 8 whose output is being linearized. The ultra-linear chirp generator of the present invention may satisfy the requirements of a swept local oscillator (SLO) for use in a wide bandwidth compressive receiver, although the ultra-linear chirp generator of the present invention may also have application in frequency modulated continuous wave (FMCW) or pulse compression radar systems.

An SLO formed from the chirp generator of the present invention may have various bandwidths, chirp time, retrace/settling time, linearity and signal to noise ratio (SNR) requirements. For example, the SLO may have the following requirements: a bandwidth of between 2.75–3.75 GHz, a chirp time of 1 μsec, a retrace/settling time of 25 nsec, a linearity of less than 0.15% and a SNR of greater than 60 dB. Such requirements may be met by the ultra-linear chirp generator of the present invention.

To facilitate the description of the invention, the ultra-linear chirp generator will be described with features that satisfy the SLO requirements of a wide bandwidth compressive receiver stated above, although it is to be understood that the ultra-linear chirp generator of the present invention will satisfy other SLO requirements.

As mentioned previously, the VCO 8 has a tuning characteristic which is naturally nonlinear. The linear chirp generator of the present invention which employs this VCO 8 will effectively linearize the output signal of the VCO so that the VCO will generate a linear frequency versus time chirp.

The VCO 8 is preferably a commercially available silicon bipolar transistor oscillator utilizing a hyperabrupt varactor as the frequency varying element. Use of a hyperabrupt varactor provides a very linear tuning characteristic (for example, less than 1.5%) over the frequency range of interest, (for example, 2.75–3.75 GHz, as mentioned previously). A linear VCO is desirable for this application because a linear VCO needing a small amount of correction will have better linearity stability than a nonlinear VCO requiring a lot of correction.

The VCO 8 preferably has an internal voltage regulator to minimize pushing effects from power supply variations. To minimize pulling effects due to output load variations, the VCO also preferably includes attenuator pads and an output buffer amplifier.

For the particular SLO requirements described above, the VCO 8 of the ultra-linear chirp generator of the present invention has a tuning bandwidth which preferably exceeds 100 MHz and, therefore, will not limit the tuning modulation and dynamic response of the chirp generator.

AVCO which was tested for use in the present invention had a 75 ppm temperature coefficient of tuning sensitivity, which will vary the chirp slope by approximately ±0.25% over a 0° to 70° C. operating range. This will have a negligible effect on the corrected chirp linearity of the VCO.

Another major section of the ultra-linear chirp generator of the present invention is the linear ramp generator 2. The linear ramp generator 2 is shown in block diagram form in FIG. 2 of the drawings, and corresponding waveforms of the signals associated with the ramp generator are shown in FIGS. 3A–3C.

The linear ramp generator 2 of the present invention preferably includes two embedded feedback loops, which result in a high speed (1 μsec ramp with 25 nsec retrace and settling time), ultra-linear (less than 0.1%) voltage versus time waveform. The feedback loops are also used to minimize drift effects caused by changes in the operating environment as well as component aging.

The linear ramp generator 2 also includes a storage device which accumulates charge thereon. The first feedback loop is coupled to the storage device and controls the rate of charge accumulating on the storage device. The second feedback loop is also coupled to the storage device and maintains the charge on the storage device at a constant average level.

Figures 2, 3A, 3B:
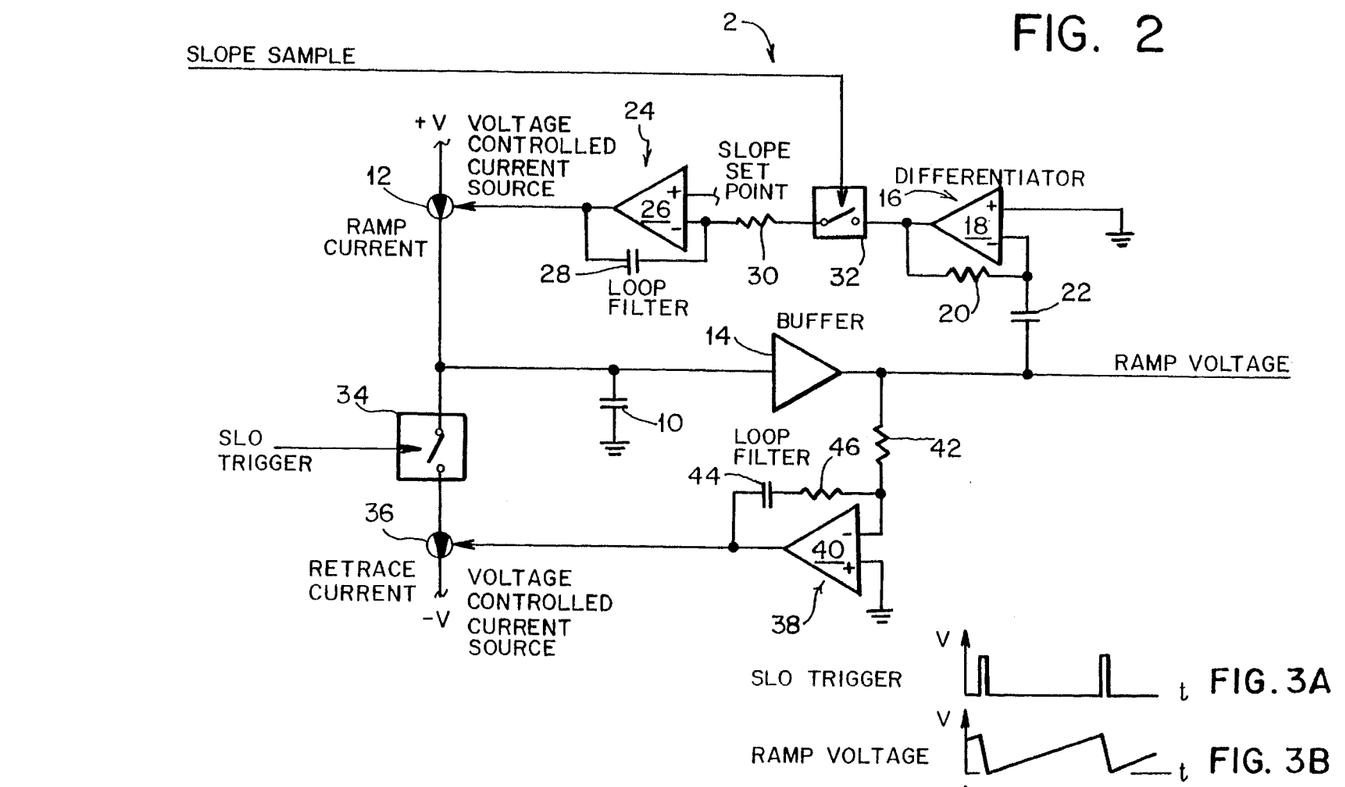
FIG. 2 is a block diagram of a first section of the ultra-linear chirp generator shown in FIG. 1.
FIGS. 3A, 3B and 3C are voltage versus time graphs of signals associated with the first section of the ultra-linear chirp generator shown in FIG. 2.
Figure 3C:
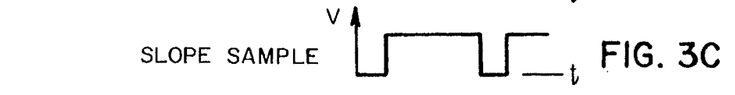

More specifically and in accordance with a preferred form of the present invention, the storage device is a capacitor 10, as shown in FIG. 2. The first feedback loop includes a first precision voltage controlled current source (VCCS) 12 to supply a constant charging current to the capacitor 10, resulting in a linear voltage versus time waveform across the capacitor, i.e., a linearly ramping voltage.

The first feedback loop also includes a buffer amplifier 14 and a differentiator 16. The linearly ramping voltage across the capacitor 10 is provided to the buffer amplifier 14 which provides a buffered output signal corresponding to the voltage waveform across the capacitor. The buffered output signal is used as the output signal of the linear ramp generator 2. The buffered output signal is provided to the input of the differentiator 16 which is preferably formed of an operational amplifier 18. More specifically, the noninverting input of the operational amplifier 18 is connected to ground, and the inverting input of the amplifier 18 is connected to a feedback resistor 20 and to a capacitor 22 used for differentiating the input signal. The buffered output signal is provided to the other end of the capacitor 22.

The differentiator 16 effectively differentiates the buffered output signal, which corresponds to the linearly ramping voltage waveform across the capacitor 10, and generates an output signal which is effectively a DC voltage that is proportional to the slope of the ramping voltage across the capacitor 10.

The first feedback loop also includes a comparator and, preferably, a filter circuit 24, also formed from an operational amplifier 26. More specifically, the noninverting input of the operational amplifier 26 of the comparator and the loop filter 24 is provided with a predetermined voltage corresponding to a slope set point, and the inverting input of the operational amplifier 26 is connected to a feedback capacitor 28 and input resistor 30, the other end of the input resistor 30 being provided with the output signal of the differentiator 16.

Effectively, the DC voltage provided on the output of the differentiator 16 is compared to the slope set point voltage in the comparator and loop filter 24. The comparator and loop filter 24 will generate a slope control signal in the form of a voltage which is proportional to the difference between the DC voltage and the slope set point voltage. This slope control signal is provided to the first VCCS 12, which accordingly adjusts the charging current to the capacitor 10. Accordingly, the first feedback loop is used to maintain a constant slope on the linearly ramping output signal of the ramp generator 2.

Preferably, an electronic switch 32 is interposed between the output of the differentiator 16 and the inverting input of the amplifier forming the comparator and loop filter 24 of the first feedback loop. The opening and closing of the switch 32 is selectively controlled by a slope sample signal so that the feedback path of the first loop is closed only during a predetermined period of time when the voltage on the capacitor 10 is linearly increasing, i.e., only during the ramp period of time. The feedback path is then opened by the switch 32 to remove a pulse associated with the differentiation of the ramp retrace, as will be described in greater detail.

The second feedback loop is used to control the retrace of the linearly ramping output signal of the ramp generator 2 and to maintain the voltage of the ramping output signal at a constant DC level. Retrace of the ramping output signal is achieved through a second electronic switch 34 and a second precision VCCS 36.

More specifically, the second switch 34 is connected between the storage capacitor 10 and the second VCCS 36, and the opening and closing of the switch 34 is electronically controlled by an SLO trigger signal. For approximately 20 nsec, the second switch 34 closes, causing the second VCCS 36 to supply a constant discharging current through the capacitor 10, in other words, to remove charge accumulated on the capacitor, resulting in a rapid retrace of the output signal of the ramp generator 2. Because the retrace current supplied by the second VCCS 36 is about 50 times larger than the charge current supplied by the first VCCS 12, the output signal of the generator returns back to the starting point of the linear ramp very quickly.

The second feedback loop includes a second comparator and, preferably, a loop filter 38 formed from an operational amplifier 40. More specifically, the comparator and loop filter 38 includes an input resistor 42 provided to the inverting input of the operational amplifier 40, and a series arrangement of a capacitor 44 and resistor 46 providing feedback for the amplifier. The non-inverting input of the operational amplifier 40 is provided with a DC voltage which corresponds to a particular DC set or end point which, in the preferred embodiment shown in FIG. 2, is ground.

The second comparator and loop filter 38 generates an end point control signal in the form a voltage proportional to the difference between the DC end point (e.g., ground) and the output signal of the buffer amplifier 14, and this control voltage is provided to the second VCCS 36. As a result of this control voltage, the second VCCS 36 will change the storage capacitor's discharging current. Thus, the two feedback loops work together to maintain the slope and average DC level of the periodic, linearly ramping output signal of the linear ramp generator.

Waveforms of the signals associated with the linear ramp generator are shown in FIGS. 3A, 3B and 3C. The SLO trigger signal (FIG. 3A) is preferably a narrow pulse (approximately 20 nsec) having a period of about 1 μsec. The signal causes the output signal (i.e., the ramp voltage shown in FIG. 3B) to retrace by quickly returning to its starting point. The slope sample signal is a negative going pulse which is timed to be aligned with and envelop the SLO trigger pulse to open the first feedback loop at the output of the differentiator during the retrace time. In this way, the retrace of the linearly ramping output signal of the generator 2 does not affect the slope of the linearly increasing ramped portion of the output signal.

Figure 4:
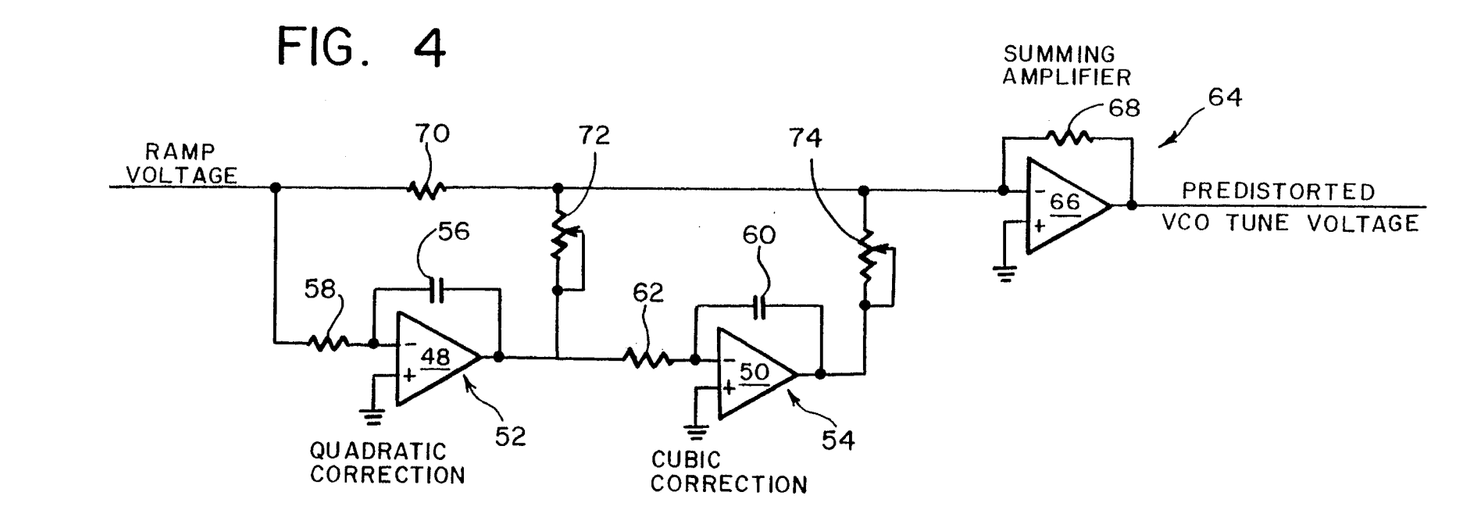
FIG. 4 is a block diagram of a second section of the ultra-linear chirp generator shown in FIG. 1.

As mentioned previously, another major section of the ultra-linear chirp generator of the present invention is the polynomial correction waveform generator 4. One form of the polynomial correction waveform generator 4 is shown in FIG. 4 of the drawings. The polynomial correction waveform generator 4 shown in FIG. 4 generates a quadratic correction signal and a cubic correction signal which are summed together to create the polynomial predistortion used to linearize the VCO tuning characteristic. By providing the VCO 8 with a ramp voltage (i.e., the linearly ramping output signal from the linear ramp generator 2) that has been predistorted (by the polynomial correction waveform generator 4) with a nonlinearity opposite to the natural nonlinearity of the VCO tuning characteristic, a linear frequency versus time chirp is obtained.

Because of the repetitive nature of the linearly ramping output signal of the ramp generator, the quadratic and cubic correction signals may be generated in several ways, such as by Gilbert cell multipliers or integrators. In the preferred embodiment shown in FIG. 4 of the drawings, operational amplifiers 48, 50 configured as integrators 52, 54 are used because of the relatively low frequencies involved and their simplicity of use.

As more specifically shown in FIG. 4, the output signal (i.e., the ramp voltage) of the linear ramp generator 2 is provided to the first integrator 52 formed from an operational amplifier 48 having its non-inverting input coupled to ground and its inverting input coupled to a feedback capacitor 56 and an input resistor 58. With the linear ramp voltage from the ramp generator as the input, the first integrator 52 generates the quadratic correction signal (i.e., an $x^2$ term; the ramp voltage corresponds to the x term in the polynomial equation). The quadratic correction signal generated by the first integrator 52 is provided to the second integrator 54, which also is formed from an operational amplifier 50 having its non-inverting input connected to ground and its inverting input connecting to a feedback capacitor 60 and an input resistor 62. The second integrator 54 generates the cubic correction signal (i.e., an $x^3$ term). The quadratic and cubic correction signals make up the polynomial correction signal generated by the polynomial correction waveform generator 4.

The polynomial correction waveform generator 4 also includes a summing amplifier 64. The summing amplifier 64 is formed from an operational amplifier 66 having its non-inverting input connected to ground and its inverting input connected to a feedback resistor 68 and three input resistors 70, 72, 74. More specifically, the output signal of the linear ramp generator 2 is provided to the first input resistor 70, the quadratic correction signal is provided to the second input resistor 72 and the cubic correction signal is provided to the third input resistor 74. The second and third input resistors 72, 74 may be in the form of potentiometers having their wipers connected to one end of the resistor, so that the resistances may be adjusted and therefore the contribution of the quadratic correction signal and cubic correction signal in generating a predistorted VCO tuning signal may be independently varied. The summing amplifier 64 generates a predistorted VCO tuning signal which is provided to the VCO 8 and which is used to tune the VCO to create the chirp.

By summing the original ramp voltage (i.e., the output signal of the linear ramp generator 2) with the appropriate amount of quadratic and cubic correction from the first and second integrators 52, 54, the VCO tuning polynomial predistortion signal is generated.

Figure 5A:
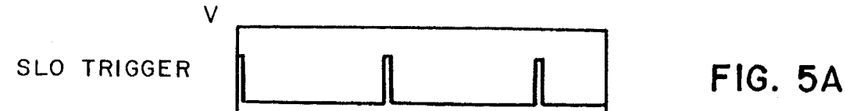
FIGS. 5A, 5B, 5C and 5D are voltage versus time graphs of signals associated with the second section of the ultra-linear chirp generator shown in FIG. 4.
Figure 5B:
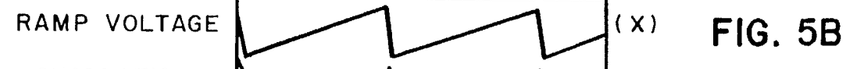
Figure 5C:
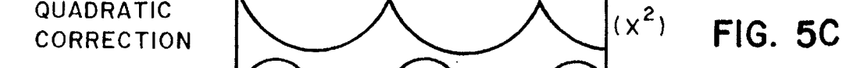
Figure 5D:
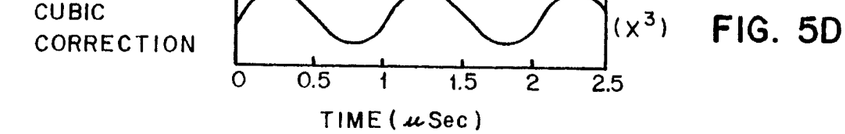

The ramp voltage (i.e., the output signal of the linear ramp generator 2) is illustrated by FIG. 5B, and its alignment is shown with the SLO trigger signal illustrated by FIG. 5A. The quadratic correction signal generated by the first integrator 52 and the cubic correction signal generated by the second integrator 54 are respectively shown in FIGS. 5C and 5D.

Figure 6:
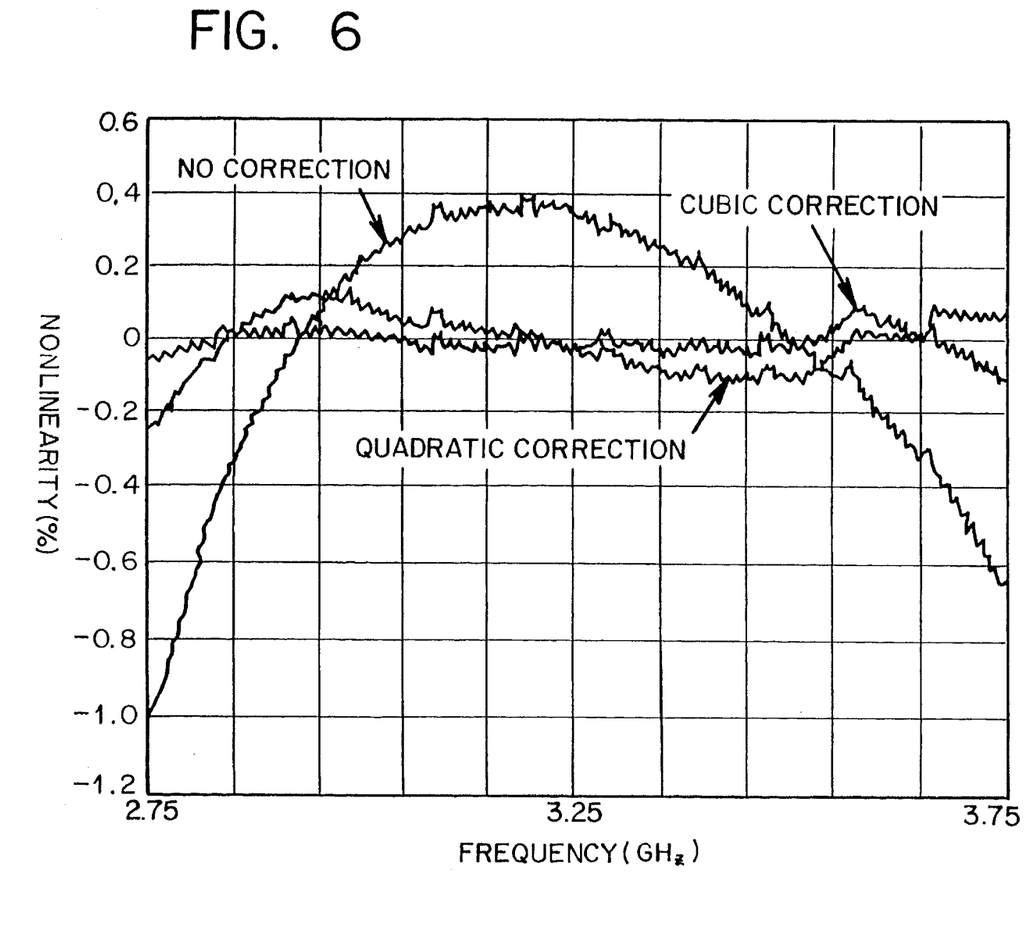
FIG. 6 is a graph of nonlinearity versus frequency of a in the ultra-linear chirp generator of the present invention. signal generated by a voltage controlled oscillator (VCO) used

FIG. 6 shows the nonlinearity (in percent) over frequency of the VCO output signal with no correction, with just quadratic correction (that is, by summing just the ramp voltage and the quadratic correction signal) and with cubic correction (that is, by summing the ramp voltage, the quadratic correction signal and the cubic correction signal). The resultant nonlinearities in the VCO output signal are approximately 15% 0.25% and 0.15% respectively The weight (that is, the polynomial coefficient) of each correction signal (i.e., the quadratic and cubic correction signals) and the ramp voltage and therefore its contribution to generating the predistorted VCO tuning signal may be determined statically by first plotting the deviation from linear of the VCO tuning characteristic and adjusting the associated resistors and potentiometers for the ramp voltage and quadratic and cubic correction signals such that a "best fit" waveform for the predistorted VCO tuning signal is generated. A "best fit" signal may be verified by computer simulation, as described in detail with respect to FIG. 8 of the drawings.

Alternatively, a conventional curve fitting algorithm embodied in software may be used to determine the weight of each polynomial coefficient. For example, one may take the VCO tuning characteristic which is nonlinear, and may curve fit to the tuning characteristic by using the curve fitting software. From this, the software will provide the ratio of ramp to quadratic to cubic corrections necessary to replicate the VCO tuning characteristic. One may then invert the quadratic and cubic corrections to generate a predistorted VCO tuning signal having a nonlinearity which is opposite to the natural nonlinearity of the VCO tuning characteristic. A suitable curve fitting software which may be used for this purpose is Matlab (TM), which is manufactured by The Math Works, Inc. of South Natick, Massachusetts.

Although only a quadratic correction signal and a cubic correction signal generated by the first and second integrators 52, 54, respectively, are described, it is envisioned to be within the scope of the present invention to provide a polynomial correction signal which includes fourth order (i.e., $x^4$), fifth order (i.e., $x^5$) and greater order correction signals, each being independently adjustable with its own potentiometer, which are summed in the summing amplifier 64 and generated by a series connection of integrators, in the same manner as described previously with respect to the quadratic and cubic correction signal integrators 52, 54, in order to provide a polynomial correction signal to linearize the chirp generated by the VCO 8.

Another major preferred section of the ultra-linear chirp generator of the present invention is the phase locked loop (PLL) 6. The PLL 6 is shown in greater detail in FIG. 7 of the drawings. While the linear ramp generator 2 and polynomial correction waveform generator 4 are used to linearize the VCO output signal for an ultra-linear chirp, it is the purpose of the PLL 6 to maintain the average frequency of the chirp output.

Figure 7:
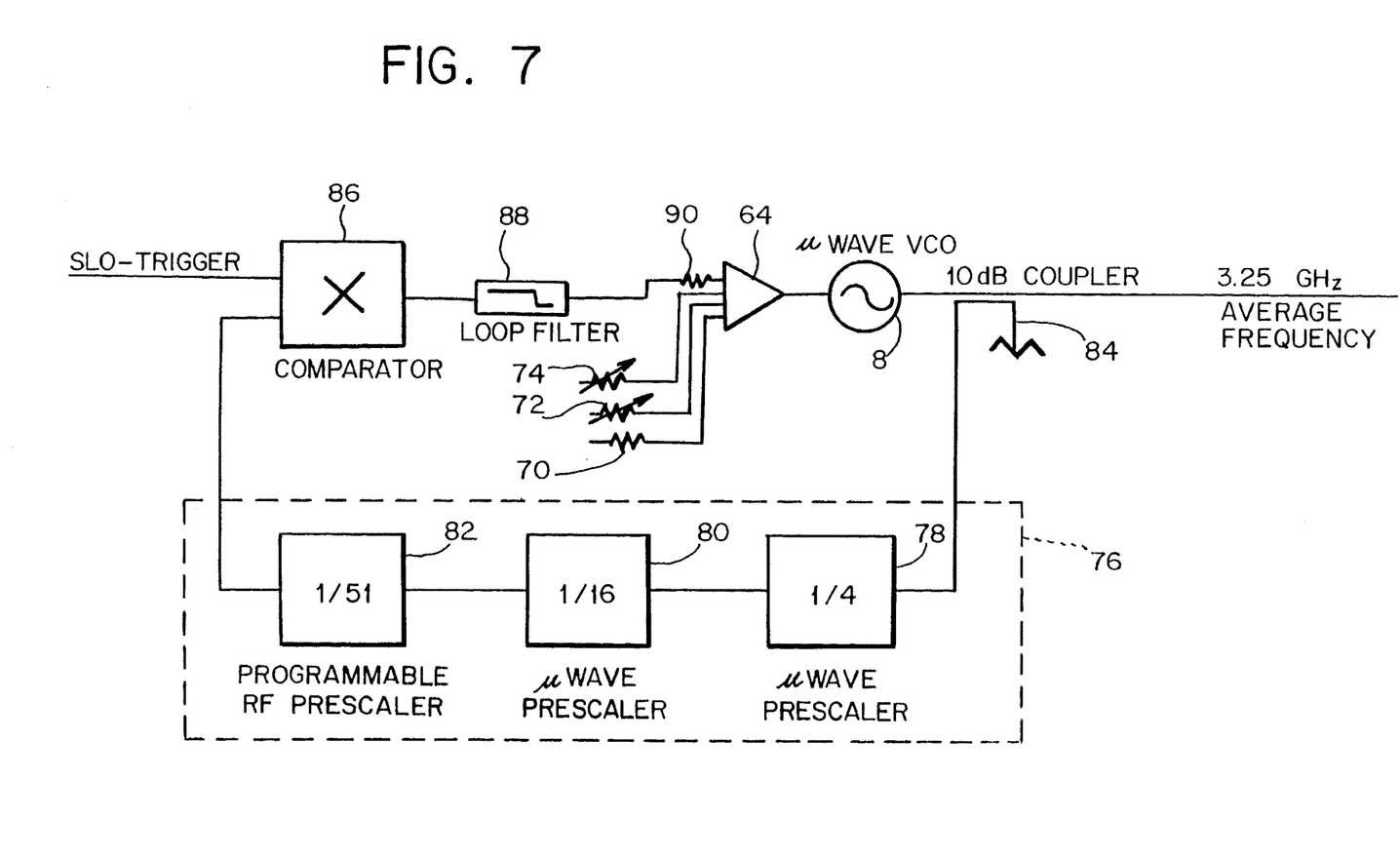
FIG. 7 is a block diagram of a third section of the ultra-linear chirp generator shown in FIG. 1.

More specifically, the linear ramp generator 2, in the example described herein, is set to chirp the VCO output 1

GHz in the 1 μsec repetition period. The PLL 6 locks the average frequency during the same 1 μsec period to 3.25 GHz, which is midway between the two end frequencies, 2.75 and 3.75 GHZ. In other words, the 1 GHz chirp is symmetric about the mean of 3.25 GHz and, therefore, the output chirps the intended range of 2.75 to 3.75 GHz. So that the PLL 6 will not distort the modulation characteristic (i.e., the chirp), the PLL bandwidth and reference frequency must be properly chosen. As long as the PLL reference frequency is fundamentally or subharmonically related to the repetition rate of the modulating signal (i.e., the chirp), the PLL 6 will be completely unaffected by the modulation, as described in the article, *Wideband Phased-Locked Angular Modulator*, NASA TECH BRIEF, Vol. 15, No. 12, Item No. 140, by L. Nguyen. Out of convenience, the SLO trigger signal was chosen as the PLL reference and is, therefore, fundamentally related to the repetition rate of the chirp.

As shown in FIGS. 1 and 7, the PLL preferably includes a prescaler or frequency divider 76 which divides the frequency of the VCO output signal by N, where N is an integer greater than 0. In the embodiment shown in FIG. 7, several microwave prescalers 78, 80, 82 are used. A first prescaler 78 is coupled to the output of the VCO 8 through a coupler, such as a 10 dB coupler 84, and divides the frequency of the VCO output signal by 4. The output signal of the first prescaler 78 is provided to the input of a second prescaler 80, which divides the signal provided to it now by 16. The output of the second prescaler 80 is provided to a programmable radio frequency (RF) prescaler 82, which, in the embodiment shown in FIG. 7, divides the signal provided to it by 51. The series arrangement of the three prescalers 78–82 divides the mean frequency of 3.25 GHz of the chirp down to the 1 MHz reference frequency of the PLL, i.e., the SLO trigger signal.

The output signal of the programmable RF prescaler 82 is provided to one input of a phase comparator 86, whose other input is provided with the SLO trigger signal. The comparator 86 compares the phases of the two signals and generates a phase correction signal proportional to the difference in the phases of the two input signals, and provides the phase correction signal to the input of a loop filter 88. The loop filter 88 filters the phase correction signal and provides an output signal which is summed with the polynomial correction waveform signal through a fourth input resistor 90 of the summing amplifier 64. The output of the summing amplifier 64 is provided to the input of the VCO 8 to complete the PLL.

Even though the PLL 6 has a low bandwidth, it is preferable to use one or more microwave prescalers 76–82 due to the wide modulation bandwidth (i.e., 1 GHz). Without microwave prescalers, the VCO output may have to be down converted for the PLL feedback or, alternatively, the whole chirp generator of the present invention would be run subharmonically and later be multiplied up to the proper frequency range and bandwidth. Although these approaches may be suitable in some applications, they are not without sacrifice to performance, complexity, power consumption and cost.

The programmable prescaler 82 is preferably used in the PLL 6 of the ultra-linear chirp generator in order to easily adapt the circuit for various SLO configurations, that is, to change the average output frequency of the VCO 8.

The ultra-linear chirp generator and method of tuning a VCO using polynomial predistortion, in accordance with the present invention, was tested and found to meet the SLO requirements of a wide bandwidth compressive receiver. Salient performance characteristics included the verification of the chirp linearity and the improvement in the multiple signal dynamic range of the compressive receiver.

Figure 8:
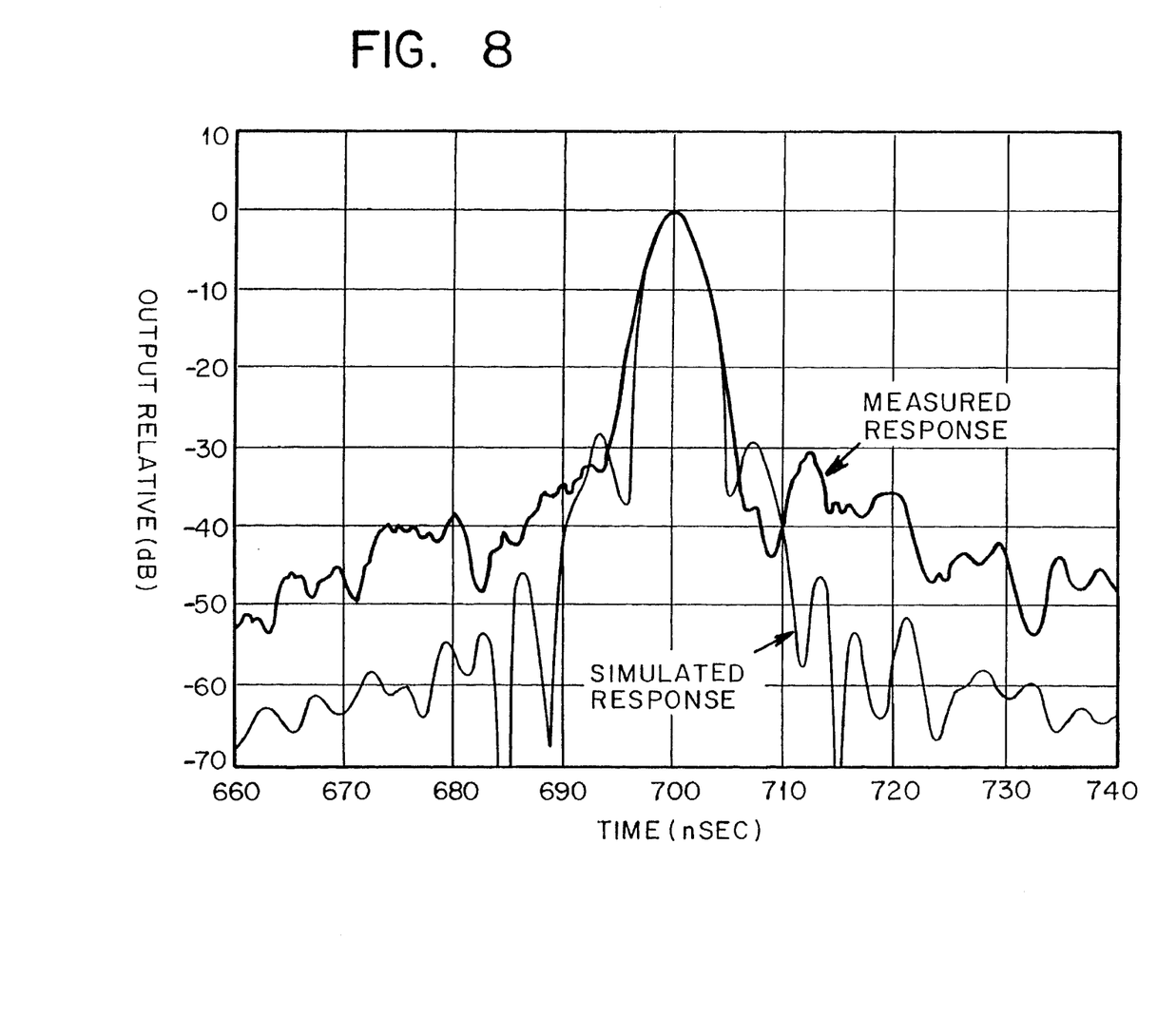
FIG. 8 is a graph of relative magnitude in decibels (dB) versus time of a comparison between a simulated response and a measured response of the output pulse sidelobe rejection of a compressive receiver.

Computer simulations confirmed that the remaining chirp nonlinearity and dispersive delay line (DDL) mismatch will result in compressive receiver output pulse close-in sidelobe rejections similar to those actually measured. This comparison is shown in FIG. 8 of the drawings. The model for the simulation included the residual nonlinearities of the SLO (less than 0.15%) and an ideal DDL. The resemblance of close-in sidelobe structure shows that the correction of the statically characterized VCO tuning curve is effective in linearizing the chirp output of the VCO under dynamic conditions. The differences in the other sidelobe structures are primarily due to the unmodeled effects of system noise and the DDL amplitude and phase ripples.

Figure 9:
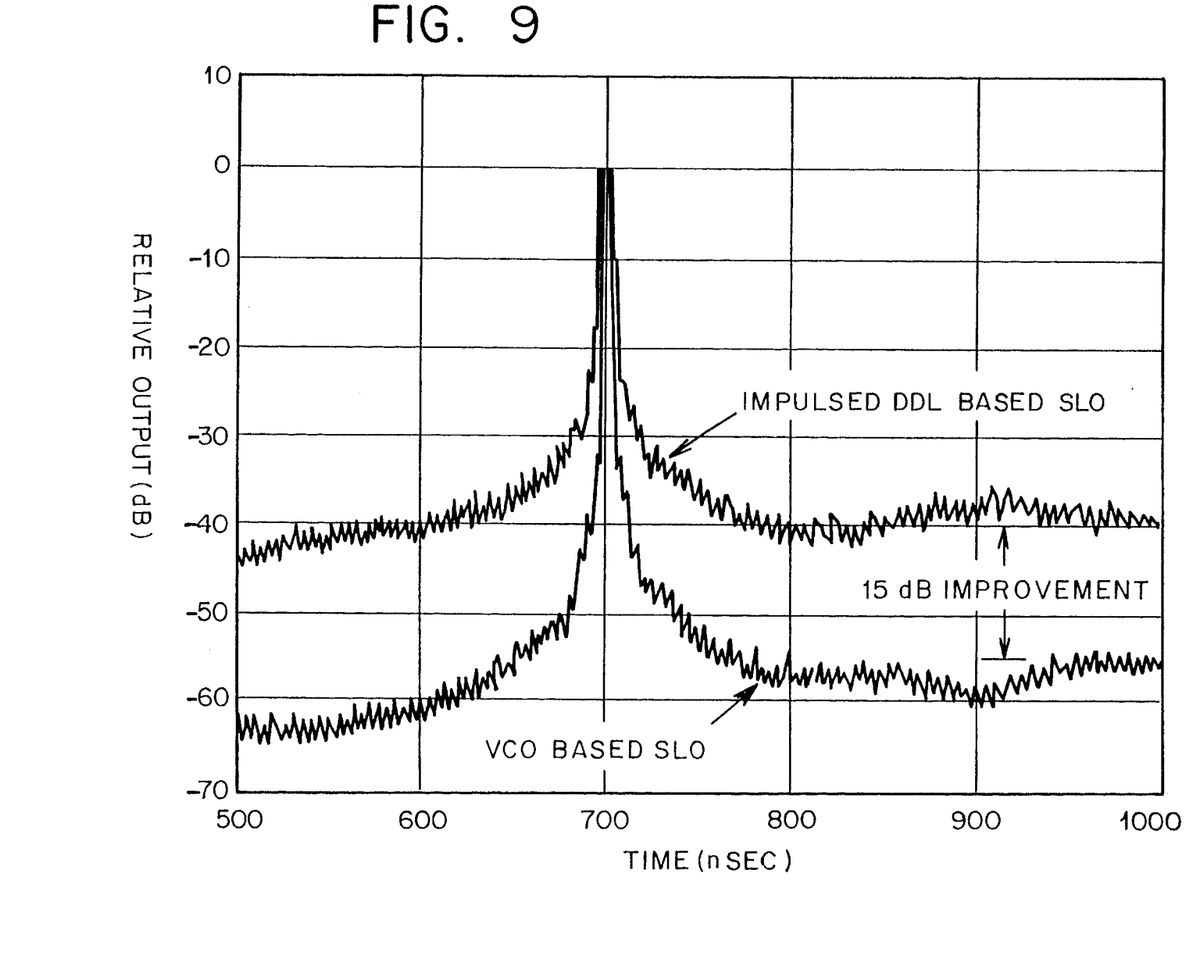
FIG. 9 is a graph of relative magnitude in decibels (dB) versus time comparing the multiple signal dynamic range of a compressive receiver using a conventional impulsed DDL based SLO and a VCO based SLO formed in accordance with the present invention.

Because the VCO based SLO formed in accordance with the present invention does not have the inherent noise and spurious responses associated with an impulsed DDL based SLO, there is an increase of 15 dB in the compressive receiver multiple signal dynamic range. This comparison is shown in FIG. 9 of the drawings. The VCO based SLO formed in accordance with the present invention clearly shows a 15 dB noise floor improvement over the impulsed DDL based SLO. This improvement in noise floor corresponds directly to the multiple signal dynamic range enhancement.

As is evident from the previous description, the present invention provides a method and structure for high speed, wide bandwidth, ultra-linear microwave chirp generation having a high signal to noise ratio (SNR). The method and structure of the invention also provides for long term average frequency stabilization of the chirp and a simple, analytically derived tune predistortion alignment of the chirp which is generated. The linear ramp generator 2 used in the ultra-linear chirp generator of the present invention provides cooperating feedback loops which minimize drift effects caused by changes in the operating environment as well as component aging, and also maintains a constant slope on the linearly ramping output signal which is generated, and further maintains the average DC level of the output signal. The chirp generator also maintains the average frequency of the chirp output, and is programmable to easily change the average output frequency so that the chirp generator is easily adapted for various SLO configurations.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A linear chirp generator employing a voltage controlled oscillator (VCO) having a tuning characteristic which is naturally nonlinear, which comprises:

a nonlinear voltage controlled oscillator (VCO);

a linear ramp generator, the linear ramp generator generating a linearly ramping output signal having a linear slope characteristic with respect to time;

a polynomial correction waveform generator, the polynomial correction waveform generator generating a polynomial correction signal;

a summer, the summer being responsive to and summing the linearly ramping output signal of the ramp generator and the polynomial correction signal of the polynomial correction waveform generator and generating a VCO tuning signal for tuning the VCO, the tuning signal corresponding to the linearly ramping output signal predistorted with a nonlinearity opposite to the natural nonlinearity of the VCO tuning characteristic, the tuning signal being provided to the VCO, the VCO generating an output signal in the form of a linear frequency versus time chirp.

2. A linear chirp generator as defined by claim 1, which further comprises:

a phase locked loop (PLL), the PLL being responsive to the output signal of the VCO, the PLL having a reference frequency which is related to the repetition rate of the VCO output signal, the PLL generating an output signal, the PLL output signal being provided to the summer, the summer summing the PLL output signal with the linearly ramping output signal and polynomial correction signal whereby the average frequency of the VCO chirp output signal is maintained.

3. A linear chirp generator as defined by claim 2, wherein the linear ramp generator is responsive to a periodic trigger signal provided thereto, the linear ramp generator generating the linearly ramping output signal with a period corresponding to that of the trigger signal; and wherein the PLL includes:

a prescaler, the prescaler being responsive to the VCO output signal and generating an output signal which is 1/N times the average frequency of the VCO output signal, where N is an integer greater than 0;

a phase comparator, the phase comparator being responsive to and phase comparing the output signal from the prescaler and the trigger signal and generating a phase correction signal in response thereto; and a loop filter, the loop filter being responsive to the phase correction signal of the phase comparator and generating an output signal in response thereto, the output signal of the loop filter being provided to the summer.

4. A method of generating a linear chirp from a voltage controlled oscillator (VCO) having a tuning characteristic which is naturally nonlinear, which comprises the steps of:

generating a linearly ramping signal having a linear slope characteristic with respect to time;

generating a polynomial correction signal;

summing the linearly ramping signal and the polynomial correction signal and generating from the summation thereof a tuning signal for tuning the VCO, the tuning signal corresponding to the linearly ramping signal predistorted with a nonlinearity opposite to the natural nonlinearity of the VCO tuning characteristic; and providing the tuning signal to the VCO, whereby the VCO generates an output signal having a linear frequency versus time chirp.

5. A method as defined by claim 4, which further comprises the step of:

maintaining the average frequency of the VCO chirp output signal.

6. A method as defined by claim 5, wherein the linearly ramping signal is periodic and has a period which corresponds to that of a periodic trigger signal; and wherein the step of maintaining the average frequency of the VCO chirp output signal includes the steps of:

prescaling the VCO output signal and generating from the prescaling thereof a prescaled signal which is 1/N times the average frequency of the VCO output signal, where N is an integer greater than 0;

phase comparing the prescaled signal and the periodic trigger signal and generating from the phase comparison thereof a phase correction signal in response thereto; and filtering the phase correction signal and generating from the filtering thereof a filtered signal;

and wherein the step of summing the linearly ramping signal and the polynomial correction signal further includes the step of summing the filtered signal with the linearly ramping signal and the polynomial correction signal to generate the VCO tuning signal.

* * * * *